United States Patent [19]
Ikawa et al.

[11] Patent Number: 5,864,475
[45] Date of Patent: Jan. 26, 1999

[54] POWER CONVERTER

[75] Inventors: Eiichi Ikawa, Tokyo; Akira Kawaguchi, Saitama-ken, both of Japan

[73] Assignee: Kabushiki Kaisha Toshiba, Kawasaki, Japan

[21] Appl. No.: 982,354

[22] Filed: Dec. 2, 1997

[30]    Foreign Application Priority Data

Dec. 2, 1996   [JP]   Japan ................................. 8-321644

[51] Int. Cl.⁶ ........................... H02M 1/22; H02M 7/521
[52] U.S. Cl. ............................................. 363/57; 363/136
[58] Field of Search ................................. 363/50, 54, 57, 363/85, 96, 128, 135, 136

[56]    References Cited

U.S. PATENT DOCUMENTS

| | | | |
|---|---|---|---|
| 4,156,899 | 5/1979 | Matsuda et al. | 363/138 |
| 4,703,411 | 10/1987 | Umbricht | 363/57 |
| 5,155,674 | 10/1992 | Tanoue et al. | 363/58 |
| 5,731,967 | 3/1998 | Gruning | 363/57 |

Primary Examiner—Matthew Nguyen
Attorney, Agent, or Firm—Oblon, Spivak, McClelland, Maier & Neustadt, P.C.

[57]    ABSTRACT

The power converter extracts the accumulated energy accumulated in a snubber capacitor (a first capacitor) from the second capacitor in a series circuit, composed of a second capacitor and a diode, which is provided in parallel with that snubber capacitor, and uses it as the driving power source for a self-turn-off-semiconductor device.

6 Claims, 7 Drawing Sheets

POWER CONVERTER

BACKGROUND OF THE INVENTION

1. Field of the Invention

The present invention relates to power converters and more particularly, high voltage, large capacity power converters which connect in series multiple self-turn-off-semiconductor devices.

2. Description of the Related Art

In recent years, power converters which can supply high voltages and large currents have been desired. In particular, the ability to supply 2000~3000 A or more at 100~500 KV is required by DC transmission and the like.

Figure 1A:
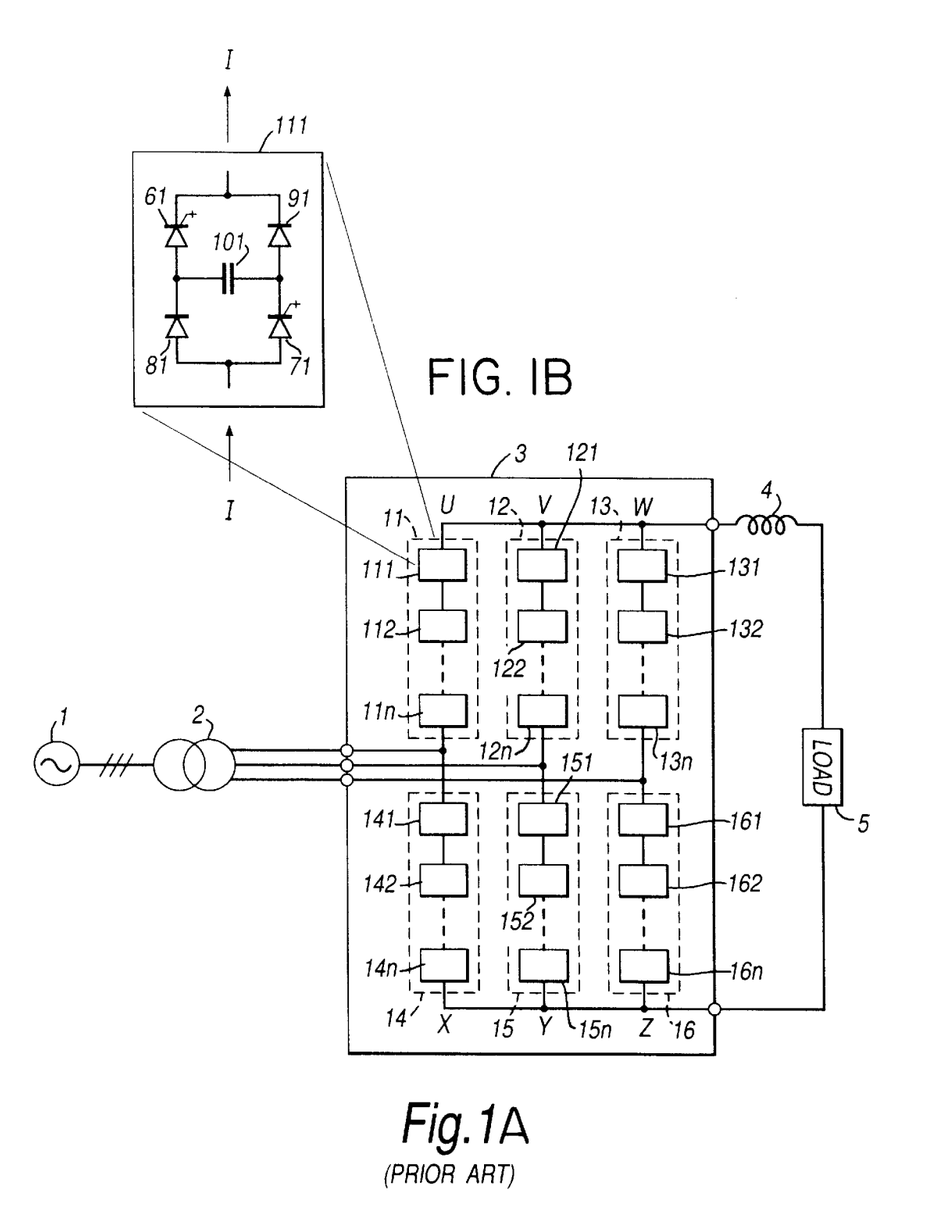
FIG. 1 is a block diagram of a prior art power converter.
Figure 2:
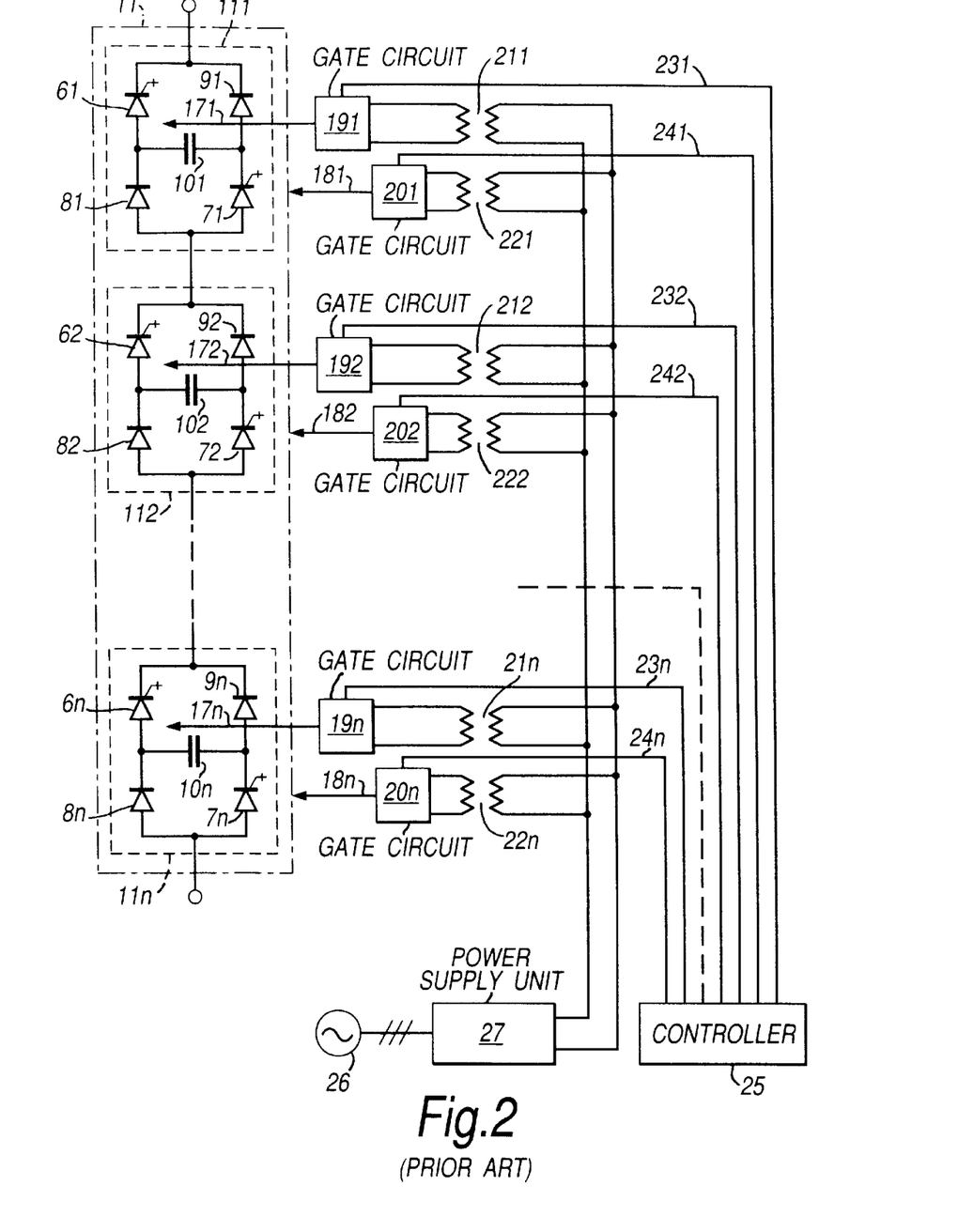
FIG. 2 is a block diagram to illustrate the problems of the prior art power converter.

FIG. 1 is a block diagram of the overall composition of a prior art power converter and of a switch unit. FIG. 2 is a block diagram of the control signal supply circuits for the gate circuits which compose the power converter in FIG. 1.

In FIG. 1, AC power source 1 is connected to converter 3 via transformer 2.

This converter 3 provides self-turn-off-semiconductor devices which are bridge-connected. The following is the description of the case when the composition uses gate turn-off thyristors (hereafter, referred to simply as "GTO") as one example. The DC current which is the output of this converter is smoothed via DC reactor 4 and supplied to DC circuit (load) 5.

The parts to which symbols 61 and 71 are assigned are GTOs. The parts to which symbols 81 and 91 are assigned are diodes. When GTOs 61 and 71 turn off, the current which was flowing in GTO 61 and 71 is led to capacitor 101. Capacitor 101 operates as a so-called snubber capacitor which restricts the forward voltage rising rates dv/dt of GTOs 61 and 71 to the permitted values for the GTO elements or less when GTOs 61 and 71 turn off. The charge accumulated in capacitor 101 is regenerated to AC power source 1 or DC circuit 5 via converter 3 when GTOs 61 and 71 turn on. The above GTOs 61 and 71, diodes 81 and 91 and capacitor 101 compose U-phase switch unit 111.

U-phase switch units 112~11n are composed in the same way.

Also, V-phase switch units 121~12n, W-phase switch units 131~13n, X-phase switch units 141~14n, Y-phase switch units 151~15n and Z-phase switch units 161~16n are composed in the same way.

Converter 3 is composed by bridge-connecting arms 11~16 which are formed from the above U-phase switch units~Z-phase switch units.

In FIG. 2, the composition of the arms is illustrated, taking U-phase arm 11 as an example.

The parts designated by symbols 191~19n and 201~20n are gate circuits which output gate signals 171~17n and 181~18n in order to turn on or turn off the respective GTOs 61~6n and 71~7n.

The control signals which control the turning on and off of each gate circuit 191~19n and 201~20n are transmitted from control system 25 via control signal lines 231~23n and 241~24n. Generally, optical cables are used for control signal lines 231~23n and 241~24n, and optical insulation is performed between control system 25 and gate circuits 191~19n and 201~20n.

The power for driving gate circuits 191~19n and 201~20n is obtained from power supply unit 27. Power supply unit 27 is connected to AC power source 26 which is obtained externally such as utility lines, and outputs a stabilised AC voltage with little voltage fluctuation. Insulation between power supply unit 27 and gate circuits 191~19n and 201~20n is performed by transformers 211~21n and 221~22n.

V-phase arm 12, W-phase arm 13, X-phase arm 14, Y-phase arm 15 and Z-phase arm 16 are composed in the same way.

The following is a description of the operation of a prior art power converter, referring to FIG. 1 and FIG. 2.

For example, in the state in which U-phase switch unit 111 is turned on, arm current I branches into a current flowing in the path of GTO 61 and diode 81 and a current flowing in the DC circuit of GTO 71 and diode 91 inside the U-phase switch unit.

When GTOs 61 and 71 turn off, arm current I shifts the conducting path to diode 81, capacitor 101 and diode 91. When capacitor 101 is charged, U-phase switch unit 111 becomes off by diodes 81 and 91 turning off.

When GTOs 61 and 71 turn on once again, capacitor 101 discharges the accumulated charge to AC power source 1 or DC circuit 5 via GTOs 61 and 71. After the discharge of capacitor 101, diodes 81 and 91 turn on, and arm current I branches as described above.

U-phase switch units 112~11n also operate in the same way.

The above operation is also performed by each of the other switch units 121~12n, 131~13n, 141~14n, 151~15n and 161~16n.

However, with the above-mentioned power converter, when used as a high voltage, large capacity power converter, as shown in FIG. 1 and FIG. 2, U-phase arm 11 is composed by connecting in series a large number of switch units 111~11n. In consequence of this, gate circuits 191~19n and 201~20n are required for respective switch units 111~11n.

As described above, the insulation of gate circuits 191~19n, and 201~20n and power supply unit 27 is performed by transformers 211~21n. However when, for example, U-phase arm 11 becomes high-voltage, it is sometimes difficult to keep insulation by transformer because the voltages to earth in the primary sides and secondary sides of transformers 211~21n differ greatly.

In this case, power cannot be supplied for driving gate circuits 191~19n and 201~20n. Therefore, this becomes an impediment to producing a high voltage, large capacity power converter.

SUMMARY OF THE INVENTION

That being the case, the object of the present invention is to provide a power converter capable of guaranteeing insulation and supplying power for driving gate circuits, even in the case of, For example, the U-phase arm becoming high-voltage and the voltages to earth in the primary sides and the secondary sides of the transformers differing greatly.

Another object of the present invention is to provide a power converter which can guarantee insulation and, at the same time, can supply gate driving power individually to the respective gate circuits, even in the case of the arms becoming high-voltage and the voltages to earth in the primary sides and the secondary sides of the transformers differing greatly.

The above object of the present invention can be achieved by providing a power converter which fulfils the following structural conditions.

The anode of a first diode is connected to the cathode of a first self-turn-off-semiconductor device, thus composing a first series circuit. The anode of a second self-turn-off-semiconductor device is connected to the cathode of a second diode, thus composing a second series circuit. A first capacitor is provided which is connected between the series connection point of the first series circuit and the series connection point of the second series circuit. The cathode of the second self-turn-off-semiconductor device and the cathode of the first diode are connected in common, and the anode of the second diode and the anode of the first self-turn-off-semiconductor device are connected in common. The arms are composed by connecting in series multiple switch units which are formed in the above way. A power converter is composed in this way.

Next, a third diode is connected in series so that the series connection point of the second series circuit becomes the cathode side. One end of a second capacitor is connected in series to the anode side of the third diode, while the other end of that capacitor is connected to the series connecting point of the first series circuit. A first power source is provided connected in parallel with this second capacitor.

Figure 3A:
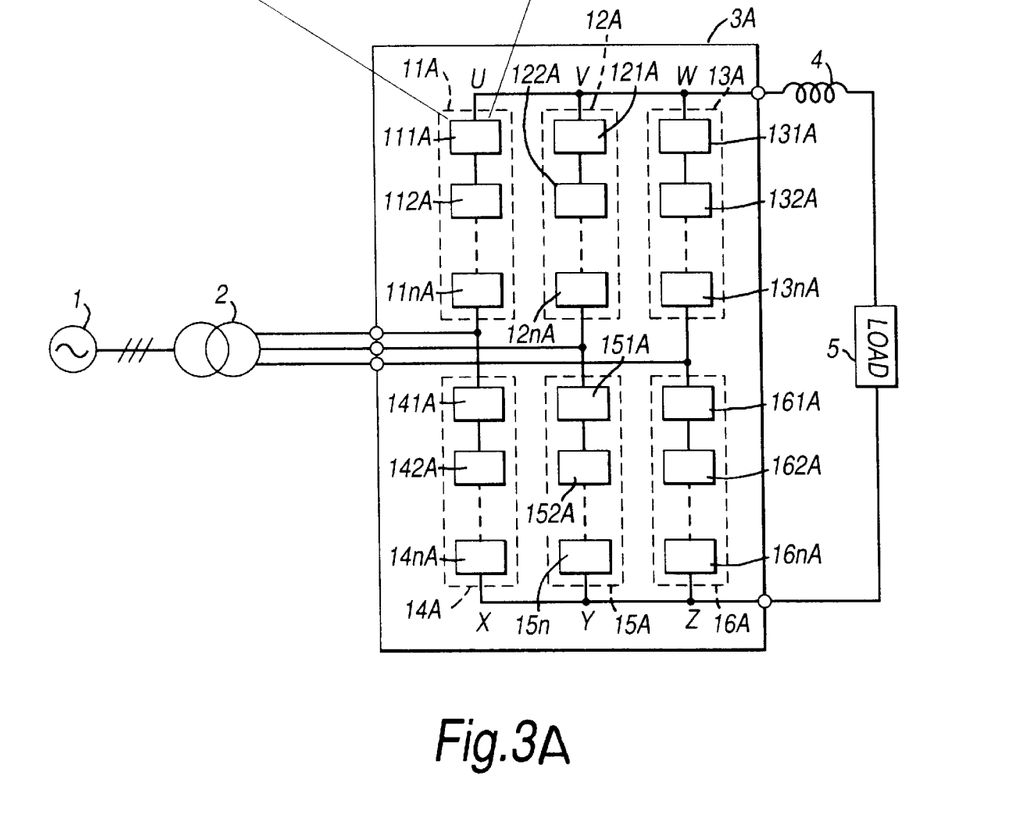
FIG. 3 is a block diagram showing a first embodiment of the power converter of the present invention.
Figure 3B:
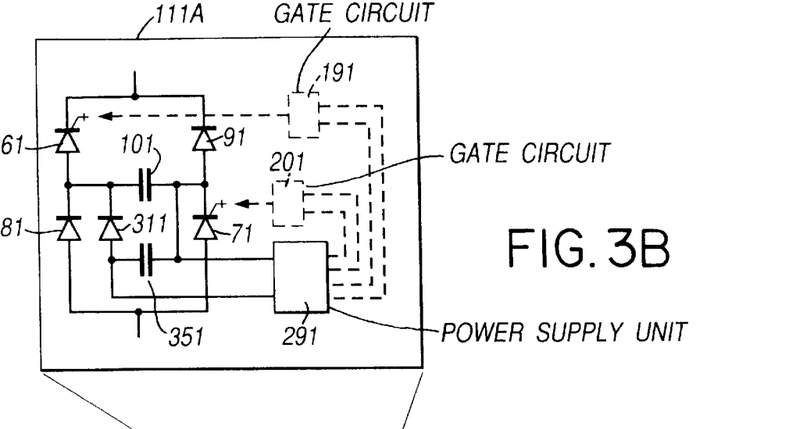

By this means, two closed-loop circuits (a closed-loop circuit formed from first self-turn-off-semiconductor device 71, second diode 81 and first capacitor 101, and an another closed loop circuit formed from second self-turn-off-semiconductor device 61, first diode 91 and first capacitor 101) are formed within switch unit 111A.

The other object of the present invention can be achieved by providing a power converter which fulfils the following structural conditions.

One end of a first reactor is connected to the cathode of a first self-turn-off-semiconductor device, while the anode of a first diode is connected to the other end of this first reactor, thus composing a first series circuit. One end of a second reactor is connected to the cathode of a second diode, while the anode of a second self-turn-off-semiconductor device is connected to the other end of this second reactor, thus composing a second series circuit. A first capacitor is provided connected between the first series connection point of the cathode of the first self-turn-off-semiconductor device and the first reactor, and a second series connecting point of the cathode of the second diode and the second reactor. A second capacitor is provided connected between a third series connection point of the anode of the first diode and the first reactor, and a fourth series connection point of the anode of the second self-turn-off-semiconductor device and the second reactor. Moreover, the cathode of the second self-turn-off-semiconductor device and the cathode of the first diode are connected in common, and the anode of the first diode and the anode of the first self-turn-off-semiconductor device are connected in common. The arms are composed by connecting in series multiple switch units which are formed in the above way. A power converter is composed in this way.

Next, a third diode is provided connected so that the second series connection point becomes the cathode side. A third capacitor is provided with one end connected to the anode side of this third diode and the other end connected to the above first series connection point. A first power source system is provided connected in parallel with the third capacitor. Furthermore, a fourth diode is provided connected so that the third series connection point becomes the anode side. A fourth capacitor is provided with one end connected to the cathode side of this fourth diode and the other end connected to the fourth series connection point. A second power source system is provided connected in parallel with this fourth capacitor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Referring now to the drawings, wherein like reference numerals designate identical or corresponding parts throughout the several views, and more particularly to FIG. 3 thereof, one embodiment of the present invention will be described.

Parts already described have been given the same symbols, and any duplication has been omitted.

Figure 4:
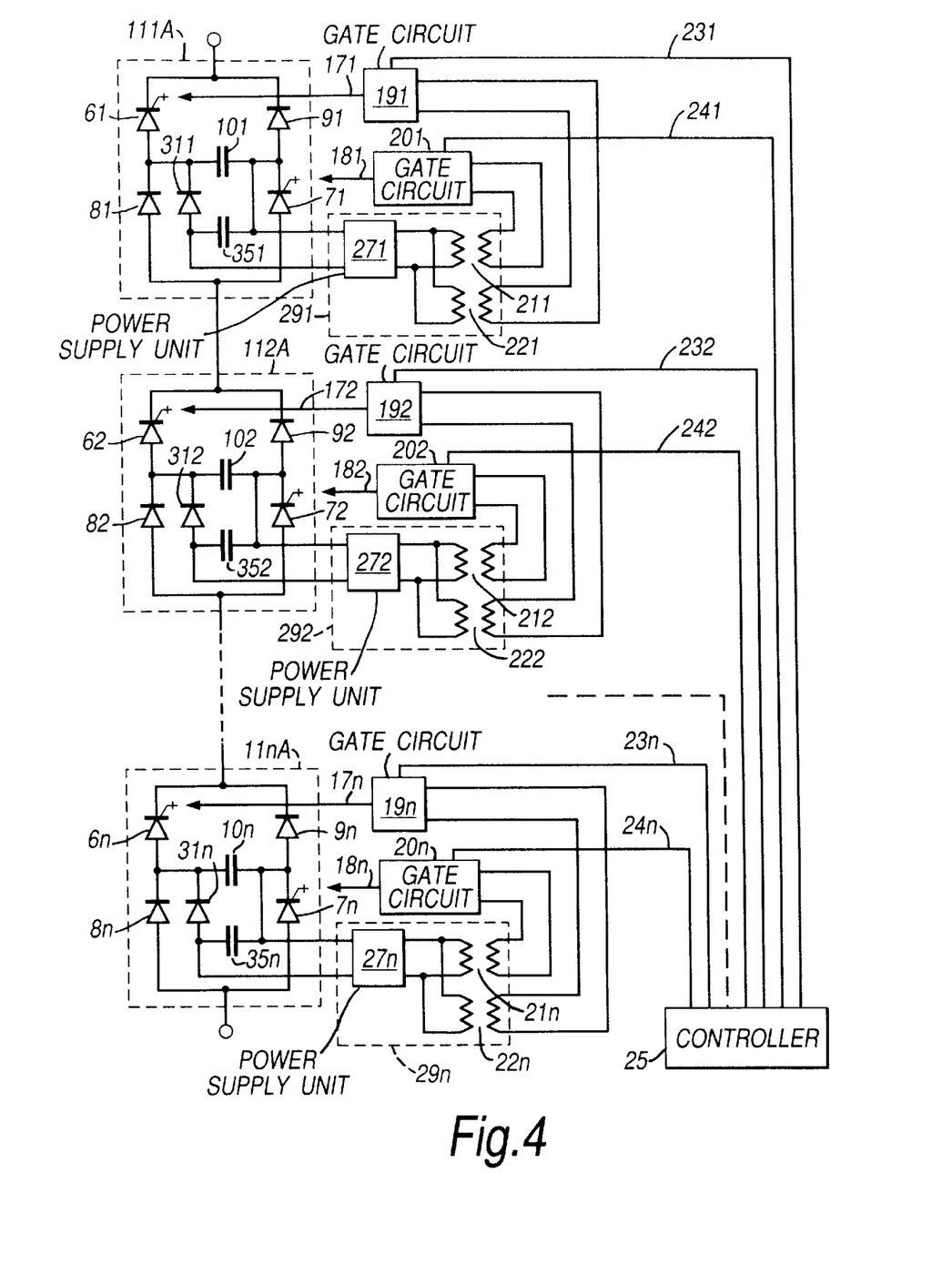
FIG. 4 is a block diagram showing details of the first embodiment in FIG. 3.

FIG. 3 is an overall block diagram of a first embodiment of the power converter of the present invention. FIG. 4 is a block diagram of the essential part of this embodiment.

The only point of difference between FIG. 3 and FIG. 1 is the internal structure of the switch unit. Switch unit 111A is described as a example.

As shown in FIG. 3, one end of capacitor 351 is series-connected to diode 311, of which the cathode side is made the connection point between the anode of GTO 61 and the cathode of diode 81. Next, the other end of capacitor 351 is connected to the connection point between the cathode of GTO 71 and the anode of diode 91. Furthermore, switch unit 111A is composed by connecting power source system 291 in parallel with capacitor 351.

U-phase switch units 112A~11nA are composed in the same way.

Also, V-phase switch units 121A~12nA, W-phase switch units 131A~13nA, X-phase switch units 141A~14nA, Y-phase switch units 151A~15nA and Z-phase switch units 161A~16nA are composed in the same way.

Next, the operation of the power converter of this embodiment is described with reference to FIG. 3 and FIG. 4.

For example, in the case of U-phase switch unit 111A, after GTOs 61 and 71 have turned on and capacitor 101 has discharged, when thereafter diodes 81 and 91 are conducting, a current will flow in the closed loop composed by GTO 61, diode 91 and capacitor 101 for the reason which is described below. Also, a current will similarly flow in the closed loop composed by GTO 71, diode 81 and capacitor 101.

These currents are mainly generated from the energy which is caused by inductance of the conductor in the above-mentioned closed loop circuits and accumulated in capacitor 351. Power source system 291, which is connected in parallel with this capacitor 351, takes the energy accumulated in capacitor 351 as a power source, and supplies power to gate circuits 191 and 201 (FIG. 4). At that time, an AC voltage is outputted by power supply unit 271 and power source system 291 guarantees the insulation between gate circuits 191 and 201 via transformers 211 and 221.

Consequently, as will be understood by comparing FIG. 4 with FIG. 2, since the power sources for gate circuits 191 and 201 are not externally dependent, there are no large differences in voltages between the primary and secondary windings of transformers 211 and 221, and the gate circuits can be driven correctly while keeping insulation.

U-phase switch units 112A~11nA operate in the same way.

Also, V-phase switch units 121A~12nA, W-phase switch units 131A~13wA, Y-phase switch units 141A~14nA, X-phase switch units 151A~15nA and Z-phase switch units 161A~16nA operate in the same way.

As described above and as shown in FIG. 3, two closed-loop circuits (a closed-loop circuit formed from first self-turn-off-semiconductor device 71, second diode 81 and first capacitor 101, and a closed loop circuit formed from second self-turn-off-semiconductor device 61, first diode 91 and first capacitor 101) are formed within switch unit 111A.

Wiring inductances are formed by the wiring of the various types of components of the above two closed loops. The energy generated by those wiring inductances is made to bypass via third diode 311 and is charged into second capacitor 351. The insulation of gate circuits 191 and 201 within the switch unit and its power source 271 can be guaranteed by extracting the charge charged in this second capacitor 351 as a power source.

Also, the energy of inductance of the conductor, which was consumed as heat by the wiring resistance and the forward voltage drops in prior art, can be used as a gate circuit power source. Thus, the power loss of the transformer reduces.

Incidentally, the composition and operation of each switch unit are the same as those of U-phase switch unit 111A. Therefore, for embodiments hereafter, an example of U-phase switch unit 111A will be presented and descriptions of U-phase switch units 112A~11nA and the other phase switch units will be omitted.

Figure 5:
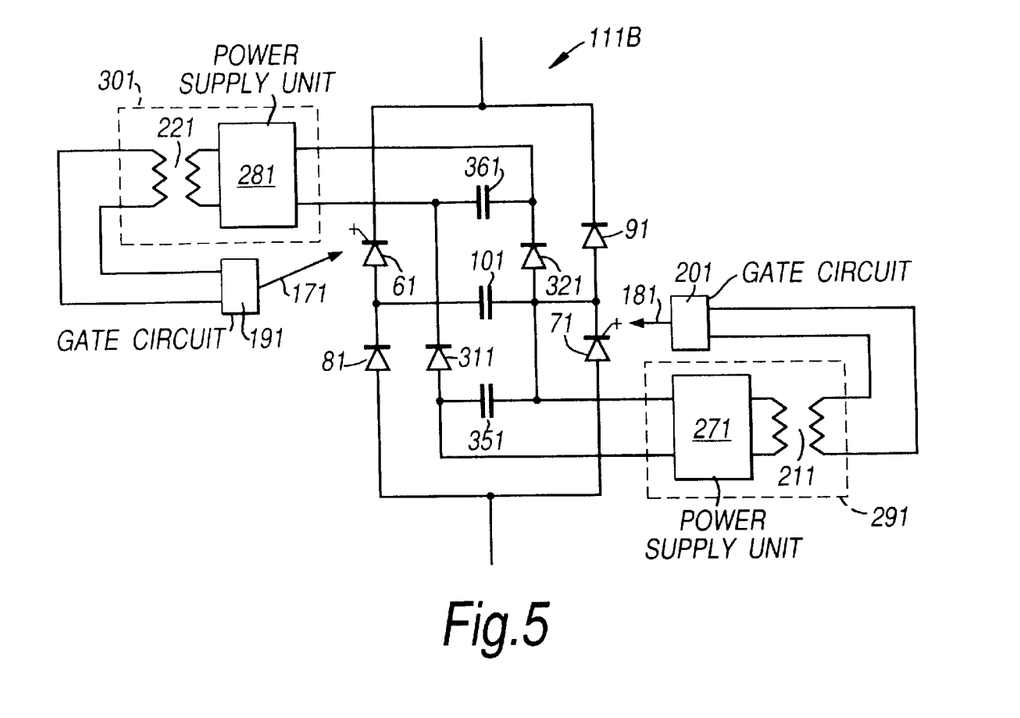
FIG. 5 is a block diagram showing a second embodiment of the power converter of the present invention.

FIG. 5 is a block diagram of a second embodiment of the power converter of the present invention.

The difference between FIG. 5 and the above FIG. 4 is that, whereas in FIG. 4 the power sources of gate circuits 191 and 201 of the respective GTOs 61 and 71 have power source system 271 in common, in FIG. 5, the respective power sources of gate circuits 191 and 201 of GTOs 61 and 71 are made separate power source systems 271 and 281.

Diode 321, of which the anode side is made the connecting point of the cathode of GTO 71 and the anode of diode 91, is connected in series with one end of capacitor 361. The other end of capacitor 361 is connected to the connection point between the anode of GTO 61 and the cathode of diode 81.

Then, switch unit 111B is composed by connecting power supply unit 281 in parallel with capacitor 361.

Next, the operation of this embodiment is described with reference to FIG. 5.

Capacitors 351 and 361 are charged by the energy of the closed loop circuits which is generated in the same way as in the above first embodiment. The respective power supply units 271 and 281, which are connected in parallel with capacitors 351 and 361, supply power to gate circuits 201 and 191 via separate transformers 211 and 221.

When composed in this way, power can be supplied for gate circuits 201 and 191 of two self-turn-off-semiconductor devices 71 and 61 from separate power supply units 271 and 281 via individual transformers 211 and 221. Therefore, the result is that the gate circuits can be correctly driven while guaranteeing insulation.

In other words, the energy generated by inductance of the conductor is caused to bypass via diode 321 and charge capacitor 361. The charged charge of this capacitor 361 is extracted as a power source. Consequently, since there are two sets of capacitors which absorb energy (capacitors 351 and 361), power can be supplied individually to the gate circuits for two self-turn-off-semiconductor devices 71 and 61.

Figure 6:
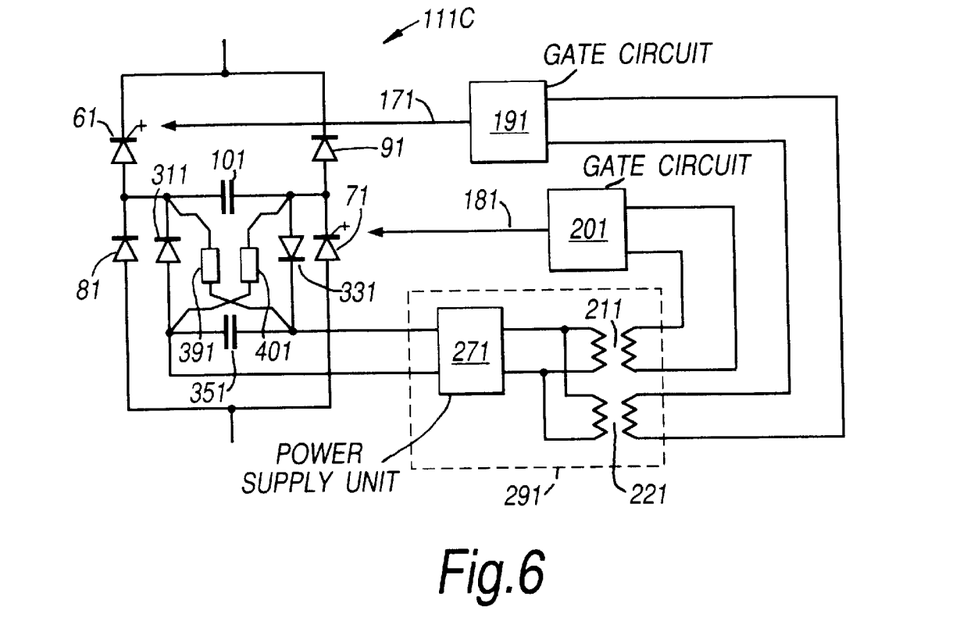
FIG. 6 is a block diagram showing a third embodiment of the power converter of the present invention.

FIG. 6 is a block diagram of a third embodiment of the present invention.

The difference between FIG. 6 and FIG. 3 is that a power source can also be obtained from capacitor 101, which operates as a snubber capacitor in switch unit 111B.

Diode 331 is added, of which the anode side is connected to the connection point between the connection point of the cathode of GTO 71 and the anode of diode 91 and capacitor 351, and the cathode side is connected to capacitor 351. Then, switch unit 111C is composed by connecting resistors 391 and 401 cross-wise between capacitor 101 and capacitor 351.

Next, the operation of this embodiment is described with reference to FIG. 6.

Capacitor 351 is charged by the energy of the closed loop circuits which is generated in the same way as in the above first embodiment. Also, in the case of the voltage of capacitor 351 being lower than the voltage of capacitor 101, it is charged to capacitor 351 by passing through resistors 391 and 401 from capacitor 101. The operation of supplying power to gate circuits 191 and 201 is the same as in the above first embodiment.

When using this embodiment, in order to use the charged energy of capacitor 101, the charging current from first capacitor 101 to second capacitor 351 is controlled by first resistor 391 and second resistor 401.

Figure 7:
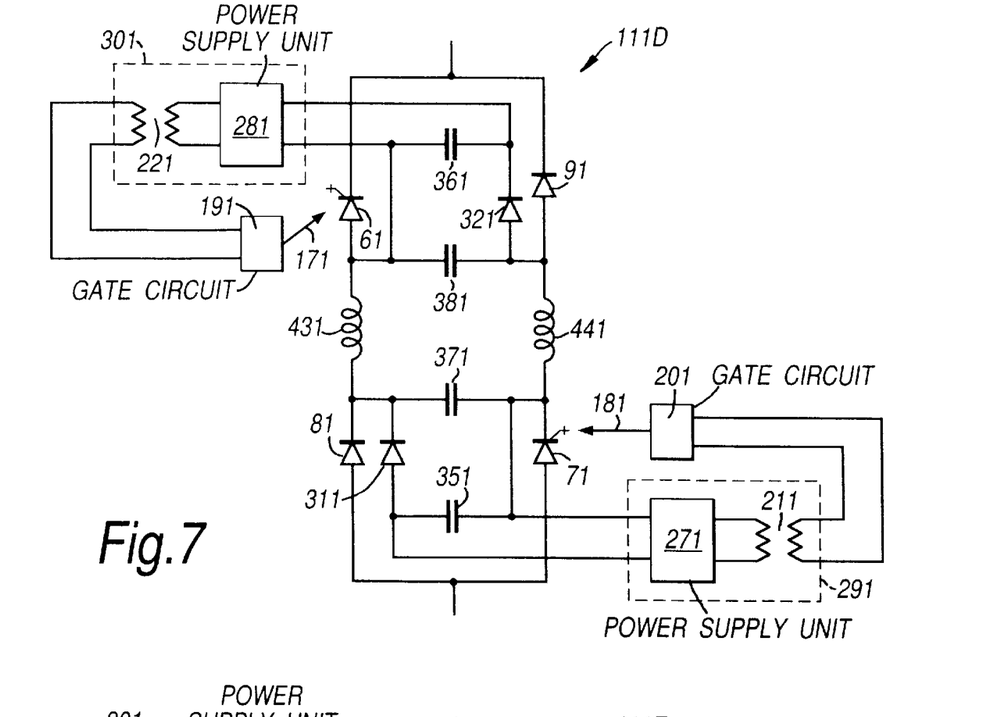
FIG. 7 is a block diagram showing a fourth embodiment of the power converter of the present invention.

FIG. 7 is a block diagram of a fourth embodiment of the present invention.

The point of difference between FIG. 7 and the above FIG. 3 is the internal structure of switch unit 111D.

Reactors 431 and 441 operate to obtain current sharing between GTOs 61 and 71 when GTOs 61 and 71 are turned on. Capacitors 371 and 381 operate as snubber capacitors. Diode 321, of which the anode side is made the connection point between reactor 441 and the anode of diode 91, is connected in series with capacitor 361. The other side of capacitor 361 is connected to the connection point between reactor 431 and the anode of GTO 61.

Also, diode 311, of which the cathode side is made the connection point between reactor 431 and the cathode of diode 81, is connected in series with capacitor 351. The other side of capacitor 351 is connected to the connection point between reactor 441 and the cathode of GTO 71.

Then, switch unit 111D is composed by connecting the respective power supply units 271 and 281 in parallel with capacitors 351 and 361.

Next, the operation of this embodiment is described with reference to FIG. 7.

After GTOs 61 and 71 have turned on and capacitors 381 and 371 have discharged, when thereafter diodes 81 and 91 are conducting, energy will be generated due to inductance of the conductor in the closed loop circuit composed by GTO 61, diode 91 and capacitor 381.

Also, in the same way, energy will be generated by inductance of the conductor in the closed loop circuit composed by GTO 71, diode 81 and capacitor 371. These energies are accumulated in the respective capacitors 351 and 361. Power supply units 271 and 281, which are connected in parallel with capacitors 351 and 361, use the energies accumulated in capacitors 351 and 361 as power sources, and supply power individually to gate circuits 191 and 201.

Figure 8:
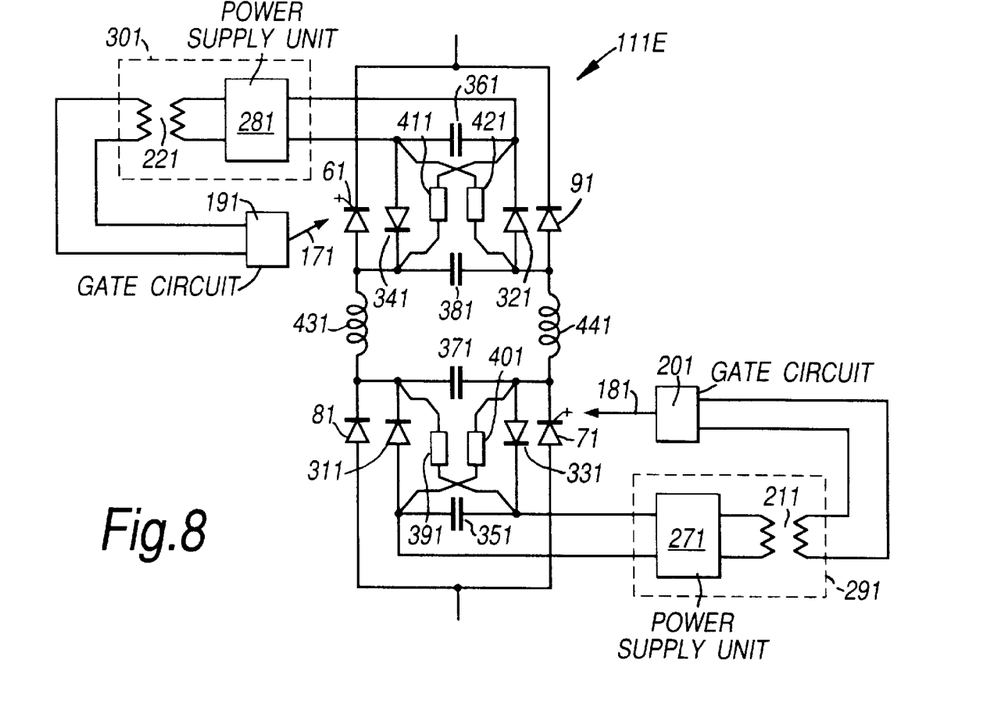
FIG. 8 is a block diagram showing a fifth embodiment of the power converter of the present invention.

FIG. 8 is a block diagram of a fifth embodiment of the present invention.

The point of difference between FIG. 8 and the above FIG. 3 is that power sources can also be obtained from capacitors 371 and 381 which are used as snubber capacitors in the switch unit.

Taking its anode side as the connection point between the cathode of GTO 71 and reactor 441, diode 331 is connected in series with capacitor 351.

Also, resistors 391 and 401 are connected cross-wise between capacitor 371 and capacitor 351. Taking the cathode side as the connection point between the anode of GTO 61 and reactor 431, diode 341 is connected in series with capacitor 361.

Then, switch unit 111E is composed by connecting resistors 411 and 421 cross-wise between capacitor 381 and capacitor 361.

Next, the operation of this embodiment is described with reference to FIG. 8.

Capacitors 351 and 361 are charged by the closed loop circuit energies which are generated in the same way as in the above fourth embodiment. Also, when the voltages across capacitors 351 and 361 are lower than the voltages of capacitors 371 and 381, charging is from capacitor 371 through resistors 391 and 401 to capacitor 351 and from capacitor 381 through resistors 411 and 421 to capacitor 361, respectively. The operation of supplying power to gate circuits 191 and 201 is the same as for the above fourth embodiment.

Figure 9:
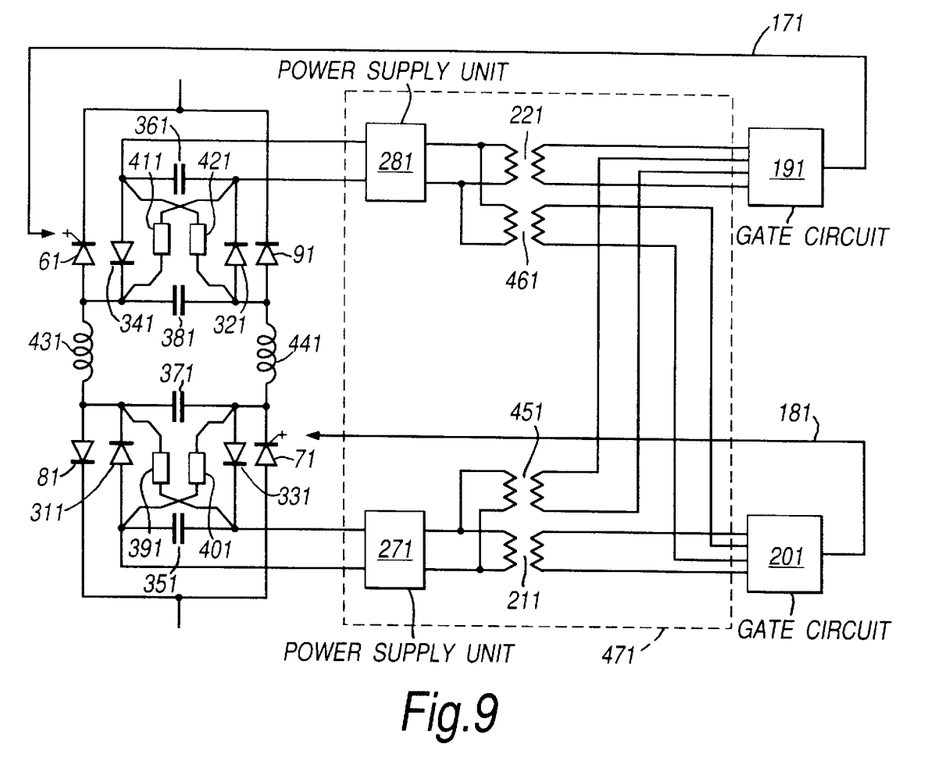
FIG. 9 is a block diagram showing a sixth embodiment of the power converter of the present invention.

FIG. 9 is a block diagram of a sixth embodiment of the present invention.

The point of difference between FIG. 9 and the above FIG. 8 is that either one or both of the power sources obtained individually from capacitors 351 and 361 can be used for power supply to the gate circuits.

Power supply unit 271, which is connected in parallel with capacitor 351, is connected to gate circuits 191 and 201 via transformers 451 and 211, respectively. Power supply unit 281, which is connected in parallel with capacitor 361 is connected to gate circuits 191 and 201 via transformers 221 and 461, respectively. Thus, switch unit 111A is composed.

Next, the operation of this embodiment is described with reference to FIG. 9.

Capacitors 351 and 361 are charged by the closed loop circuit energies and the snubber energies of capacitors 371 and 381 in the same way as in the above fifth embodiment. Power supply units 271 and 281, which are connected in parallel with capacitors 351 and 361, are both connected to gate circuits 191 and 201. Therefore, power is supplied from either one or both of power supply units 271 and 281. If this is done, power can be supplied from the two sets of power source systems 271 and 281 for one gate circuit (for example, 191).

Incidentally, in the descriptions of each of the above embodiments, the semiconductor elements which compose the power converter have been taken as GTOs. However, the present invention is not limited to GTOs alone. The same effect can be obtained even if other types of self-turn-off-semiconductor devices are used.

As described above, when using the present invention, in the two closed loop circuits which are composed inside a switch unit, the energy generated by inductance of the conductor is charged to an additional capacitor. By extracting this as a power source, the insulation of a gate circuit and its power source inside a switch unit can be guaranteed.

Also, the energies of inductance of the conductors, which were consumed as heat by the wiring resistances and forward voltage drops of the composing elements in prior art, can be used as gate circuit power sources. Therefore, the power losses of the transformers are reduced. By the above means, a high-voltage, large capacity and, moreover, efficient power converter can be provided which is composed by connecting a large number of switch units in series.

Furthermore, when using the present invention, there are two sets of capacitors which absorb the above-mentioned energy. Therefore, it is possible to provide a power converter which can supply power individually to the gate circuits for the two GTOs inside the switch unit.

Also, when using the present invention, a power converter can be provided which can supply power sources to the gate circuits by using the above energies and energies from snubber capacitors.

Moreover, when using the present invention, a power converter can be provided which can obtain power from two sets of power source systems for one gate circuit.

Obviously, numerous additional modifications and variations of the present invention are possible in light of the above teachings. It is therefore to be understood that within the scope of the appended claims, the invention may be practiced otherwise than as specially described herein.

What is claimed as new and desired to be secured by Letters Patent of the United States is:

1. A power converter having a plurality of switch units, each of the switch units comprising:
   a first series circuit in which the anode of a first diode is connected to a cathode of a first self-turn-off-semiconductor device;
   a second series circuit in which an anode of a second self-turn-off-semiconductor device is connected to a cathode of a second diode;
   a first capacitor which is connected between the series connection point of said first series circuit and a series connection point of said second series circuit;
   a third diode which is connected so that the series connection point second series circuit becomes the cathode side;
   a second capacitor of which one end is connected in series to the anode side of said of said third diode and the other end is connected to series connection point of said first series circuit
   a first power source system which is connected in parallel with the said second capacitor;
   the anode of said first self-turn-off semiconductor device of said first series circuit being connected to the anode of said second diode of said second series circuit; and the cathode of said first diode of said first series circuit being connected to the cathode of said second self-turn-off semiconductor device of said second series circuit.

2. A power converter according to claim 1, and further comprising:

a fourth diode which is connected so that the series connection point of said first series circuit becomes the anode side;

a third capacitor of which one end is connected to the cathode side of said fourth diode, and the other end is connected to the series connection point of said second series circuit; and a second power source system which is connected in parallel with said third capacitor.

3. A power converter according to claim 1, and further comprising:

a fourth diode which is inserted and connected on the connection line between the series connection point of said first series circuit and said second capacitor, taking the series connection point of said first series circuit as anode side;

a first resistor which is connected to the anode side of said fourth diode and the anode side of said third diode; and a second resistor which is connected to the cathode side of the said fourth diode and the cathode side of said third diode.

4. A power converter having a plurality of switch units, each of the switch units comprising:

a first series circuit in which one end of a first reactor is connected to a cathode of a first self-turn-off-semiconductor device, while the anode of a first diode is connected to the other end of said first reactor;

a second series circuit in which one end of a second reactor is connected to a cathode of a second diode, while an anode of a second self-turn-off-semiconductor device is connected to the other end of said second reactor;

a first capacitor which is connected between a first series connection point of the cathode of said first self-turn-off-semiconductor device and said first reactor and a second series connection point of the cathode of said second diode and said second reactor;

a second capacitor which is connected between a third series connection point of the anode of said first diode and said first reactor and a fourth series connection point of the anode of said second self-turn-off-semiconductor device and said second reactor;

a third diode which is connected so that said second series connection point becomes cathode side;

a third capacitor of which one end is connected in series with the anode side of said third diode, and the other end is connected to the said first series connection point;

a first power source system which is connected in parallel with said third capacitor;

a fourth diode which is connected so that said third series connection point becomes the anode side;

a fourth capacitor of which one end is connected in series with the cathode of said fourth diode, and the other end is connected to said fourth series connection point;

a second power source system which is connected in parallel with said fourth capacitor, the anode of said first self-turn-off semiconductor device of said first series circuit being connected to the anode of said second diode of said second series circuit; and the cathode of said first diode of said first series circuit being connected to the cathode of said second self-turn-off semiconductor device of said second series circuit.

5. A power converter according to claim 4, and further comprising:

a fifth diode which is inserted and connected on the connection line between said first series connection point and said third capacitor, taking said first series connection point as the anode side;

a first resistor which is connected to the anode side of said fifth diode and the anode side of said third diode;

a second resistor which is connected to the cathode side of said fifth diode and the cathode side of said third diode;

a sixth diode which is inserted and connected on the connection line between said fourth series connection point and said fourth capacitor, taking said fourth series connection point as the cathode side;

a third resistor which is connected to the anode side of said sixth diode and the anode side of said fourth diode; and a fourth resistor which is connected to the cathode side of the said sixth diode and the cathode side of said fourth diode.

6. A power converter according to claim 5, and further comprising:

a third power source system which receives electric energy from at least said first power source system or said second power source system cross-wisely.

* * * * *